(12) United States Patent
Choi

(10) Patent No.: US 10,866,669 B2
(45) Date of Patent: Dec. 15, 2020

(54) FLAT PANEL DISPLAY DEVICE INCLUDING TOUCH SCREEN AND METHOD OF MANUFACTURING THE SAME

(71) Applicant: Samsung Display Co., Ltd., Gyeonggi-Do (KR)

(72) Inventor: Jung Ho Choi, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/384,659

(22) Filed: Apr. 15, 2019

(65) Prior Publication Data

US 2019/0243499 A1 Aug. 8, 2019

Related U.S. Application Data

(63) Continuation of application No. 15/623,129, filed on Jun. 14, 2017, now Pat. No. 10,303,277.

(30) Foreign Application Priority Data

Jun. 28, 2016 (KR) .................. 10-2016-0081094

(51) Int. Cl.
| | |
|---|---|
| *G06F 3/041* | (2006.01) |
| *G06F 3/044* | (2006.01) |
| *H01L 27/32* | (2006.01) |
| *H01L 51/00* | (2006.01) |

(52) U.S. Cl.
CPC ............ *G06F 3/0412* (2013.01); *G06F 3/044* (2013.01); *H01L 27/3276* (2013.01); *G06F 2203/04103* (2013.01); *H01L 27/323* (2013.01); *H01L 51/0097* (2013.01)

(58) Field of Classification Search
CPC .................. G06F 3/0412; G06F 3/44; G06F 2203/04103; G06F 2203/04111; H01L 51/0097; H01L 27/3276; H01L 27/323
See application file for complete search history.

(56) References Cited

U.S. PATENT DOCUMENTS

| | | | |
|---|---|---|---|
| 2001/0022362 A1 | 9/2001 | Hayashi | |
| 2015/0145791 A1 | 5/2015 | Kim et al. | |
| 2015/0268775 A1* | 9/2015 | Yu | ............. H01L 51/56 345/173 |
| 2015/0286325 A1 | 10/2015 | Kim | |

(Continued)

FOREIGN PATENT DOCUMENTS

| | | |
|---|---|---|
| KR | 10-2015-0116985 A | 10/2015 |
| KR | 10-2015-0136732 A | 12/2015 |
| KR | 10-2016-0000696 A | 1/2016 |

*Primary Examiner* — Liliana Cerullo
(74) *Attorney, Agent, or Firm* — Innovation Counsel LLP

(57) ABSTRACT

There is provided a flat panel display device and a method of manufacturing the same. A flexible and transparent material is coated on a supporting substrate to a small thickness so that film substrates are easily formed. Step differences are formed in the film substrates so that a distance between pads of the two film substrates is reduced. Since conductive balls with reduced diameters are used so that the pads may be electrically connected, the distance between pads is reduced so that it is possible to easily miniaturize a high resolution flat panel display device, to prevent electrical connection defect between the pads, and to reduce manufacturing expenses.

19 Claims, 8 Drawing Sheets

(56) References Cited

U.S. PATENT DOCUMENTS

2016/0062520 A1 3/2016 Choi
2016/0181346 A1* 6/2016 Kwon ................. H01L 27/3276
   257/40
2017/0371461 A1* 12/2017 Lee .......................... G06K 9/00

* cited by examiner

FLAT PANEL DISPLAY DEVICE INCLUDING TOUCH SCREEN AND METHOD OF MANUFACTURING THE SAME

CROSS-REFERENCE TO RELATED APPLICATION

This application is a continuation application of U.S. patent application Ser. No. 15/623,129 filed on Jun. 14, 2017, which claims priority under 35 USC § 119 to Korean Patent Application No. 10-2016-0081094, filed on Jun. 28, 2016, in the Korean Intellectual Property Office, the entire contents of which are incorporated herein by reference in their entirety.

BACKGROUND

1. Field

An embodiment of the present inventive concept relates to a flat panel display device, and more particularly, to a flat panel display device including a touch screen and a method of manufacturing the same.

2. Description of the Related Art

Recently, a touch screen panel is being used on a liquid crystal display (LCD) or an organic light emitting display device (OLED). The touch screen panel as a device for inputting a command by contacting an object such as a user's finger or a pen recognizes a contact position by sensing capacitance between two electrodes or a voltage change and provides a user's command in accordance with the position to a display device.

A touch screen integrated display device such as an in-cell type display device is being developed in order to apply the touch screen panel to the display device.

The touch screen includes a plurality of first sensing electrodes arranged in a direction, a plurality of second sensing electrodes arranged in a direction that intersects the direction and electrically isolated from the plurality of first sensing electrodes, a plurality of conductive lines connected to the plurality of first and second sensing electrodes, and pads for providing a signal input from the outside to the first and second sensing electrodes through the conductive lines and outputting the signal sensed by the first and second sensing electrodes to the outside.

Therefore, when the touch screen is to be implemented in the display device, designing and manufacturing processes become complicated.

SUMMARY

An embodiment of the present inventive concept relates to a flat panel display device including a touch screen capable of easily miniaturizing a high resolution display device.

An embodiment of the present inventive concept relates to a method of manufacturing a flat panel display device including a touch screen capable of easily manufacturing a flexible and transparent film substrate.

An embodiment of the present inventive concept relates to a method of manufacturing a flat panel display device including a touch screen capable of reducing sizes of conductive balls and manufacturing expenses.

A flat panel display device including a touch screen according to an embodiment of the present inventive concept includes a first film substrate including a first plane and a second plane higher than the first plane, pixels provided on the first plane of the first film substrate and configured to display an image, first pads provided on the second plane of the first film substrate and to which a signal is input from outside of the flat panel display in order to display the image, second pads provided on the second plane of the first film substrate and connected to the first pads, a second film substrate arranged to face the first film substrate, a touch sensor provided on the second film substrate in a region corresponding to the pixels, third pads provided on the second film substrate in a region corresponding to the second pads and connected to the touch sensor, and a plurality of conductive balls configured to electrically connect the second pads and the third pads.

The first film substrate includes a first insulating layer overlapping the first plane and the second plane and a second insulating layer selectively disposed on the first insulating layer in a region corresponding to the second plane.

The first plane includes a display region including the pixels and a non-display region surrounding the display region.

The flat panel display device further includes at least one driving circuit provided in the non-display region of the first plane and configured to drive the pixels in accordance with a signal input from the outside through the first pads.

The pixels include organic light emitting diodes (OLED).

The touch sensor includes a plurality of first sensing electrodes arranged in a first direction and a plurality of second sensing electrodes arranged in a second direction intersecting the first direction.

The third pads are respectively connected to the plurality of first sensing electrode and the plurality of second sensing electrodes.

The second pads are disposed in a region corresponding to the third pads.

The second film substrate includes a third plane disposed in a region corresponding to the first plane and a fourth plane disposed in a region corresponding to the second plane and higher than the third plane. The touch sensor is provided on the third plane and the third pads are provided on the fourth plane.

The second film substrate includes a third insulating layer overlapping the third plane and the fourth plane and a fourth insulating layer selectively formed on the third insulating layer of the fourth plane.

The plurality of conductive balls have diameters of 5 μm through 15 μm.

The flat panel display device further includes a transparent adhesive layer interposed between the first film substrate and the second film substrate.

A method of manufacturing a flat panel display device including a touch screen according to another embodiment of the present inventive concept includes forming a first film substrate including a first plane and a second plane higher than the first plane on a first supporting substrate, forming pixels configured to display an image on the first plane of the first film substrate, forming first pads, to which a signal is input from outside of the flat panel display in order to display the image, and second pads connected to the first pads on the second plane of the first film substrate, forming a second film substrate on a second supporting substrate, forming a touch sensor and third pads connected to the touch sensor on the second film substrate, attaching the first film substrate to the second film substrate so that the second pads and the third pads are electrically connected by a plurality of conductive balls, and separating the first supporting substrate from the first film substrate and separating the second supporting substrate from the second film substrate.

The forming of the first film substrate includes forming an insulating layer on the first supporting substrate and removing the insulating layer in a region corresponding to the first plane by a predetermined thickness.

The forming of the first film substrate includes sequentially forming a first insulating layer and a second insulating layer on the first supporting substrate so as to overlap the first plane and the second plane and removing the second insulating layer in a region corresponding to the first plane.

The forming of the second film substrate includes forming an insulating layer on the second supporting substrate and removing the insulating layer in a region corresponding to the third plane by a predetermined thickness.

The touch sensor is formed on the third plane of the second film substrate and the third pads are formed on the fourth plane of the second film substrate.

The forming of the second film substrate includes sequentially forming a third insulating layer and a fourth insulating layer on the second supporting substrate so as to overlap the third plane and the fourth plane and removing the fourth insulating layer in a region corresponding to the third plane.

The touch sensor is formed on the third plane of the second film substrate and the third pads are formed on the fourth plane of the second film substrate.

The first film substrate and the second film substrate adhere to each other with a transparent adhesive layer interposed between the first film substrate and the second film substrate.

The conductive balls are interposed in the transparent adhesive layer.

The plurality of conductive balls have diameters of 5 μm through 15 μm

A flexible and transparent material is coated on a supporting substrate to a small thickness so that film substrates are easily formed. Step differences are formed in the film substrates so that a distance between pads of the two film substrates is reduced. Since conductive balls with reduced diameters are used so that the pads may be electrically connected, the distance between pads is reduced so that it is possible to easily miniaturize a high resolution flat panel display device, to prevent electrical connection defect between the pads, and to reduce manufacturing expenses.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

Figure 1A:
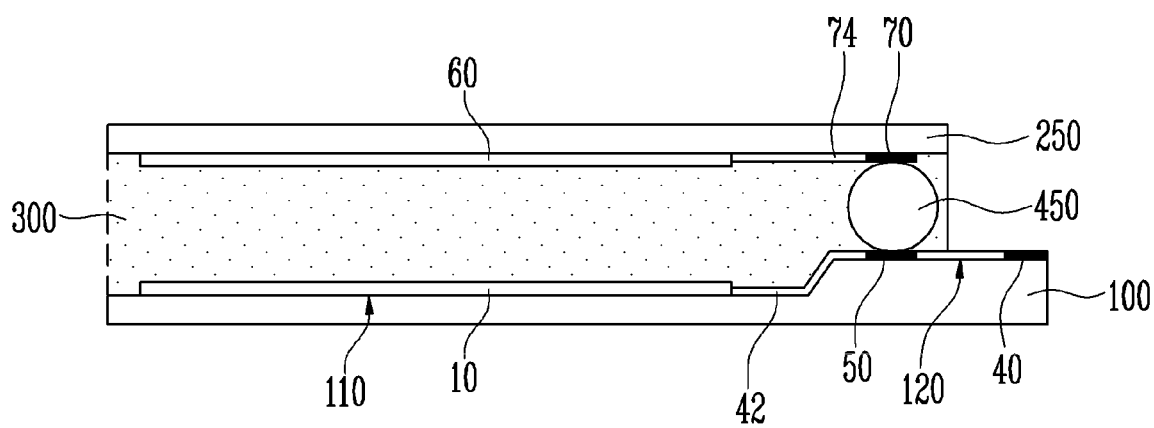
FIGS. 1A and 1B are cross-sectional views illustrating a flat panel display device including a touch screen according to embodiments of the present inventive concept.

FIG. 1A is a cross-sectional view illustrating a flat panel display device including a touch screen according to an embodiment of the present inventive concept, which will be described with reference to FIGS. 2 and 3.

Referring to FIG. 1A, the flat panel display device includes a first film substrate 100 on a surface of which step difference (difference in height) is formed, a second film substrate 250 having a flat surface, and a transparent adhesive layer 300 and a conductive ball 450 interposed between the first film substrate 100 and the second film substrate 250.

Figure 2:
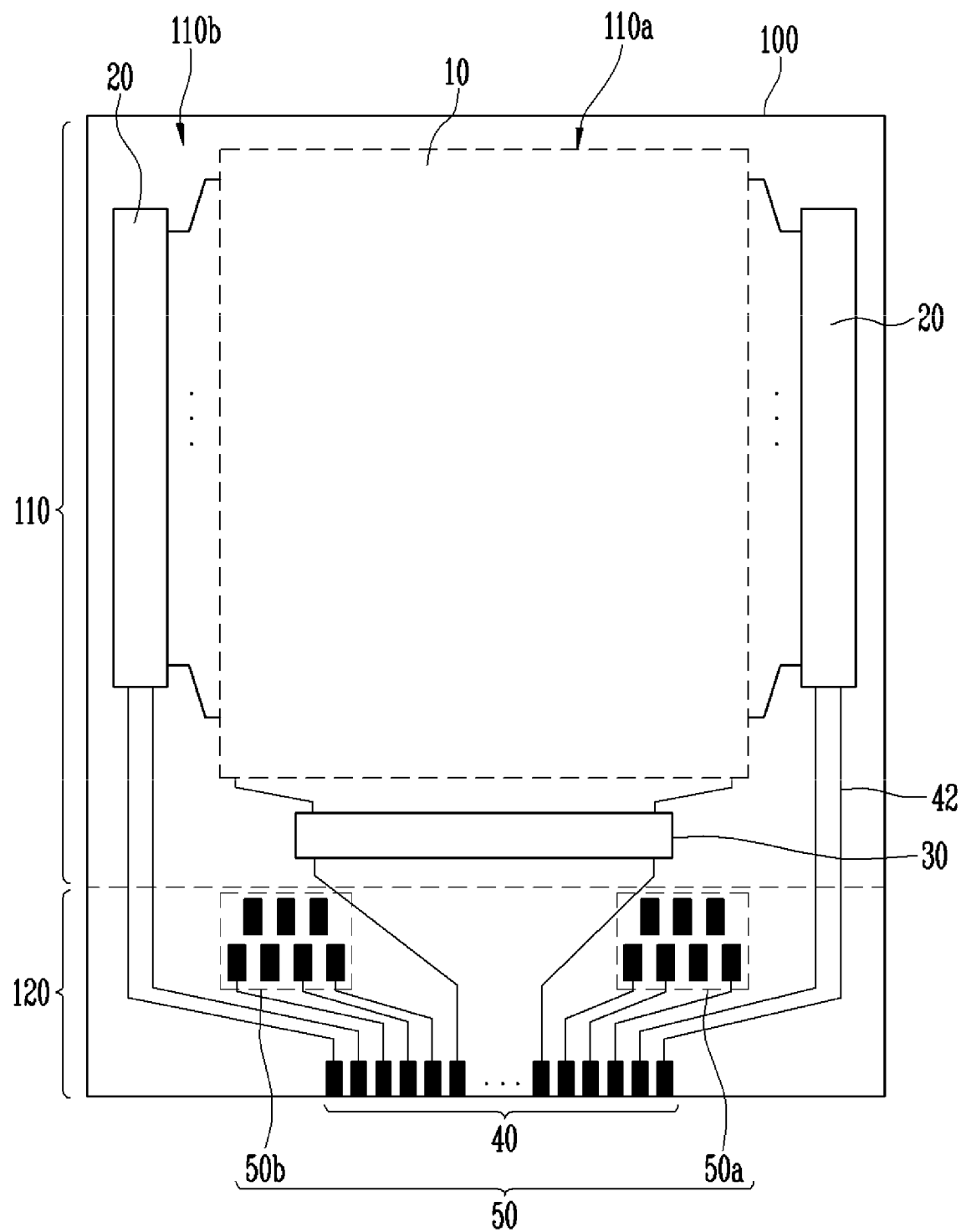
FIG. 2 is a plan view illustrating a first film substrate according to an embodiment of the present inventive concept.

Referring to FIG. 2, the first film substrate 100 includes a first plane 110 and a second plane 120 higher than the first plane 110. The surface of the first film substrate 100 has the step difference due to a difference in height between the first plane 110 and the second plane 120.

The first plane 110 of the first film substrate 100 includes a display region 110a on which an image is displayed and a non-display region 110b surrounding the display region 110a.

Pixels 10 for displaying an image is provided in the display region 110a of the first plane 110 and at least one driving circuit 20 and 30 for driving the pixels 10 may be provided in the non-display region 110b of the first plane 110.

The pixels 10 may include, for example, a plurality of organic light emitting diodes (OLED) disposed between a plurality of scan lines and a plurality of data lines in a matrix configuration and thin film transistors (TFT) and capacitors connected to the OLEDs.

The driving circuit 20, for example, as a scan driver may be connected to the plurality of scan lines (not shown). The scan driver may include the driving circuit 20 arranged at one side of the pixels 10 and connected to odd numbered scan lines and the driving circuit 20 arranged at another side of the pixels 10 and connected to even numbered scan lines.

The driving circuit 30, for example, as a data driver may be connected to the plurality of data lines (not shown). The driving circuit 30 may be arranged at another side of the pixels 10.

First pads 40 to which a signal is input from the outside in order to display the image and second pads 50 connected to the first pads 40 are provided on the second plane 120 of the first film substrate 100.

The first pads 40 includes a plurality of pads and some pads are connected to the driving circuits 20 and 30 through conductive lines 42 and the other pads are connected to the pads of the second pads 50 through the conductive lines 42.

In FIG. 2, it is illustrated that the second pads 50 is divided into first second pads 50a and second second pads 50b. However, the first second pads 50a and the second second pads 50b may be integrated into one or may be divided into a plurality of pads.

Figure 3:
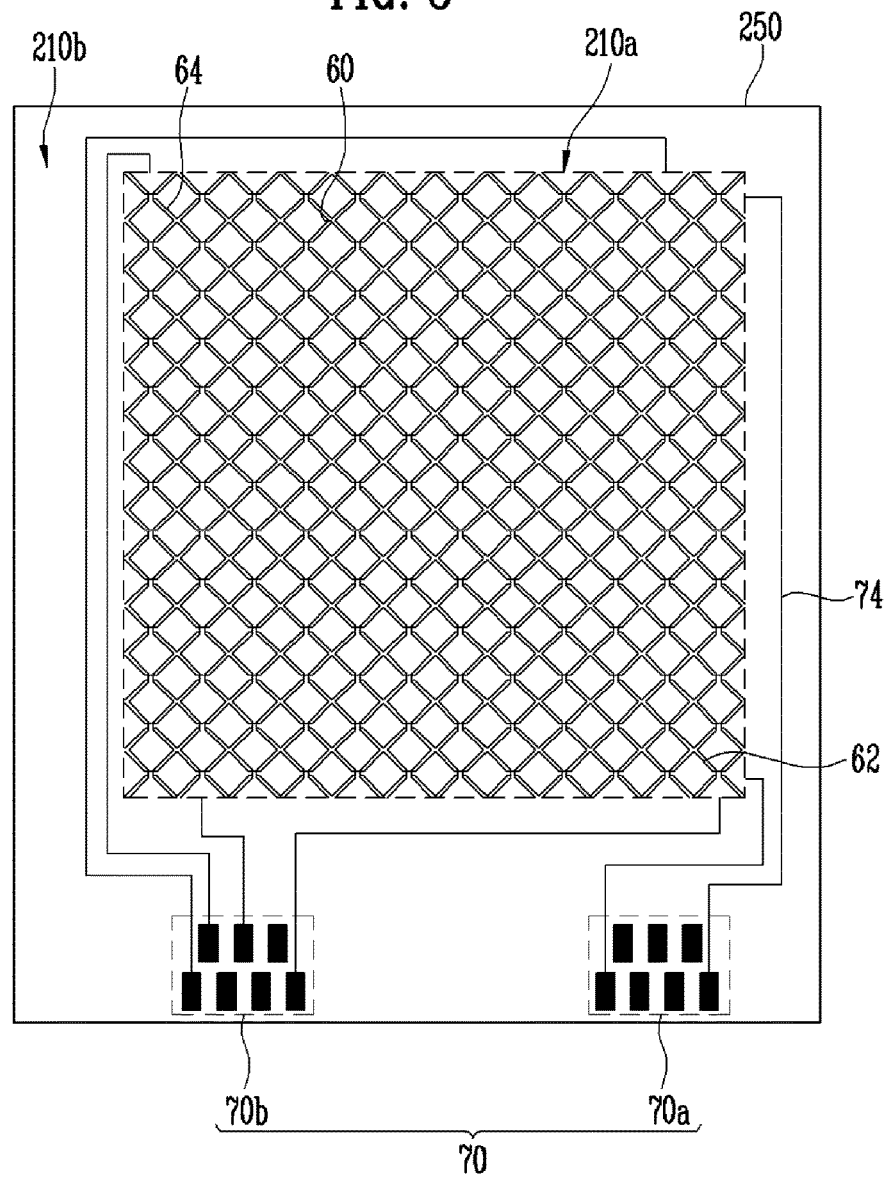
FIG. 3 is a plan view illustrating a second film substrate according to an embodiment of the present inventive concept.

Referring to FIG. 3, the second film substrate 250 includes a display region 210a corresponding to the display region 110a of the first film substrate 100 and a non-display region 210b surrounding the display region 210a. A touch sensor 60 is provided in the display region 210a and third pads 70 connected to the touch sensor 60 by conductive lines 74 is provided in the non-display region 210b. The third pads 70 are provided in a position corresponding to the second pads 50 of the first film substrate 100.

The touch sensor 60 includes a plurality of first sensing electrodes 62 arranged in a first direction (for example, an X axis direction) and a plurality of second sensing electrodes 64 arranged in a second direction (for example, a Y axis direction) that intersects the first direction. The plurality of first sensing electrodes 62 and the plurality of second sensing electrodes 64 are electrically isolated from each other.

The third pads 70 include a plurality of pads. Some pads are connected to the plurality of first sensing electrodes 62 through conductive lines 74 and the other pads are connected to the plurality of second sensing electrodes 64 through the conductive lines 74. In FIG. 3, a first third pads 70a including pads connected to the plurality of first sensing electrodes 62 and a second third pads 70b including pads connected to the plurality of second sensing electrodes 64 are illustrated. However, the first third pads 70a and the second third pads 70b may be integrated into one or may be divided into a plurality of pads.

Referring to FIG. 1A, the first film substrate 100 and the second film substrate 250 adhere to each other by the transparent adhesive layer 300 interposed between the first film substrate 100 and the second film substrate 250 so that the pixels 10 and the touch sensor 60 face each other. At this time, a plurality of conductive balls 450 are interposed between the second pads 50 and the third pads 70 so that the touch sensor 60 may be electrically connected to the first pads 40 through the third pads 70 and the second pads 50.

In order to display the image, the first pads 40 includes not only pads to which a signal is input from the outside but also pads for providing the signal input from the outside to the first and second sensing electrodes 62 and 64 through the second pads 50 and the third pads 70 or for outputting the signal sensed by the first and second sensing electrodes 62 and 64 to the outside.

Figure 1B:
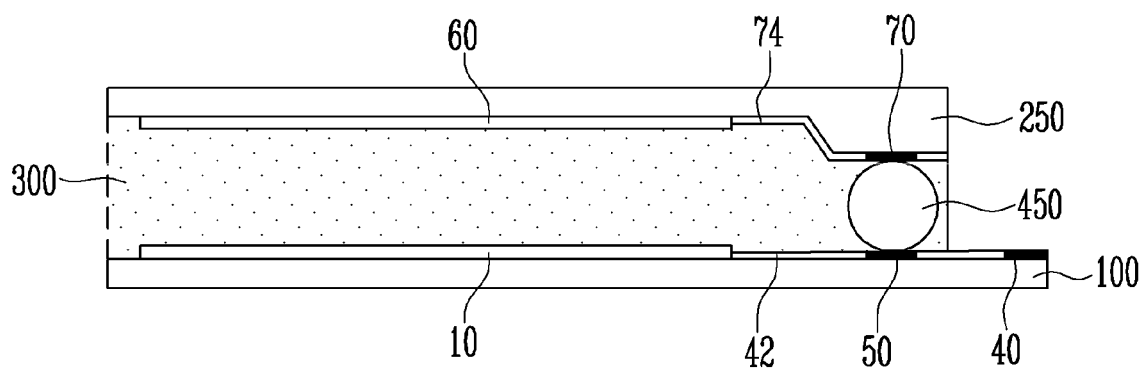

In FIG. 1A, it is illustrated that the surface of the first film substrate 100 has the step difference and the surface of the second film substrate 250 is flat. To the contrary, the surface of the first film substrate 100 may be flat and the surface of the second film substrate 250 may have step difference as shown in FIG. 1B.

Figure 4:
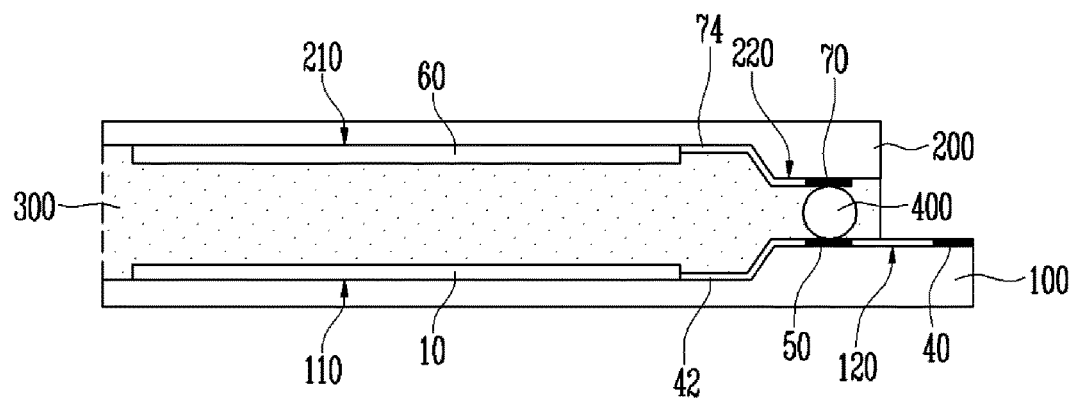
FIG. 4 is a cross-sectional view illustrating a flat panel display device including a touch screen according to another embodiment of the present inventive concept.

FIG. 4 is a cross-sectional view illustrating a flat panel display device including a touch screen according to another embodiment of the present inventive concept, which will be described with reference to FIGS. 2 and 5.

Referring to FIG. 4, the flat panel display device includes a first film substrate 100 and a second film substrate 200 on surfaces of which step differences are formed and a transparent adhesive layer 300 and a conductive ball 400 interposed between the first film substrate 100 and the second film substrate 200.

Referring to FIG. 2, the first film substrate 100 includes a first plane 110 and a second plane 120 higher than the first plane 110. The surface of the first film substrate 100 has the step difference due to a difference in height between the first plane 110 and the second plane 120.

The first plane 110 of the first film substrate 100 includes a display region 110a on which an image is displayed and a non-display region 110b surrounding the display region 110a.

Pixels 10 for displaying an image is provided in the display region 110a of the first plane 110 and at least one driving circuit 20 and 30 for driving the pixels 10 may be provided in the non-display region 110b of the first plane 110.

The pixels 10 may include, for example, a plurality of organic light emitting diodes (OLED) disposed between a plurality of scan lines and a plurality of data lines in a matrix configuration and thin film transistors (TFT) and capacitors connected to the OLEDs.

The driving circuit 20, for example, as a scan driver may be connected to the plurality of scan lines (not shown). The scan driver may include the driving circuit 20 arranged at one side of the pixels 10 and connected to odd numbered scan lines and the driving circuit 20 arranged at another side of the pixels 10 and connected to even numbered scan lines.

The driving circuit 30, for example, as a data driver may be connected to the plurality of data lines. The driving circuit 30 may be arranged at another side of the pixels 10.

First pads 40 to which a signal is input from the outside in order to display the image and second pads 50 connected to the first pads 40 are provided on the second plane 120 of the first film substrate 100.

The first pads 40 includes a plurality of pads and some pads are connected to the driving circuits 20 and 30 through conductive lines 42 and the other pads are connected to the pads of the second pads 50 through the conductive lines 42.

In FIG. 2, it is illustrated that the second pads 50 is divided into first second pads 50a and second second pads 50b. However, the first second pads 50a and the second second pads 50b may be integrated into one or the second pad 50 may be divided into a plurality of pads.

Referring to FIG. 4, the second film substrate 200 includes a third plane 210 and a fourth plane 220 higher than the third plane 210. The surface of the second film substrate 200 has the step difference due to a difference in height between the third plane 210 and the fourth plane 220.

The third plane 210 and the fourth plane 220 of the second film substrate 200 are formed in regions correspond to the first plane 110 and the second plane 120 of the first film substrate 100, respectively.

A touch sensor 60 is provided on the third plane 210 of the second film substrate 200 and the third pads 70 connected to the touch sensor 60 is provided on the fourth plane 220.

Figure 5:
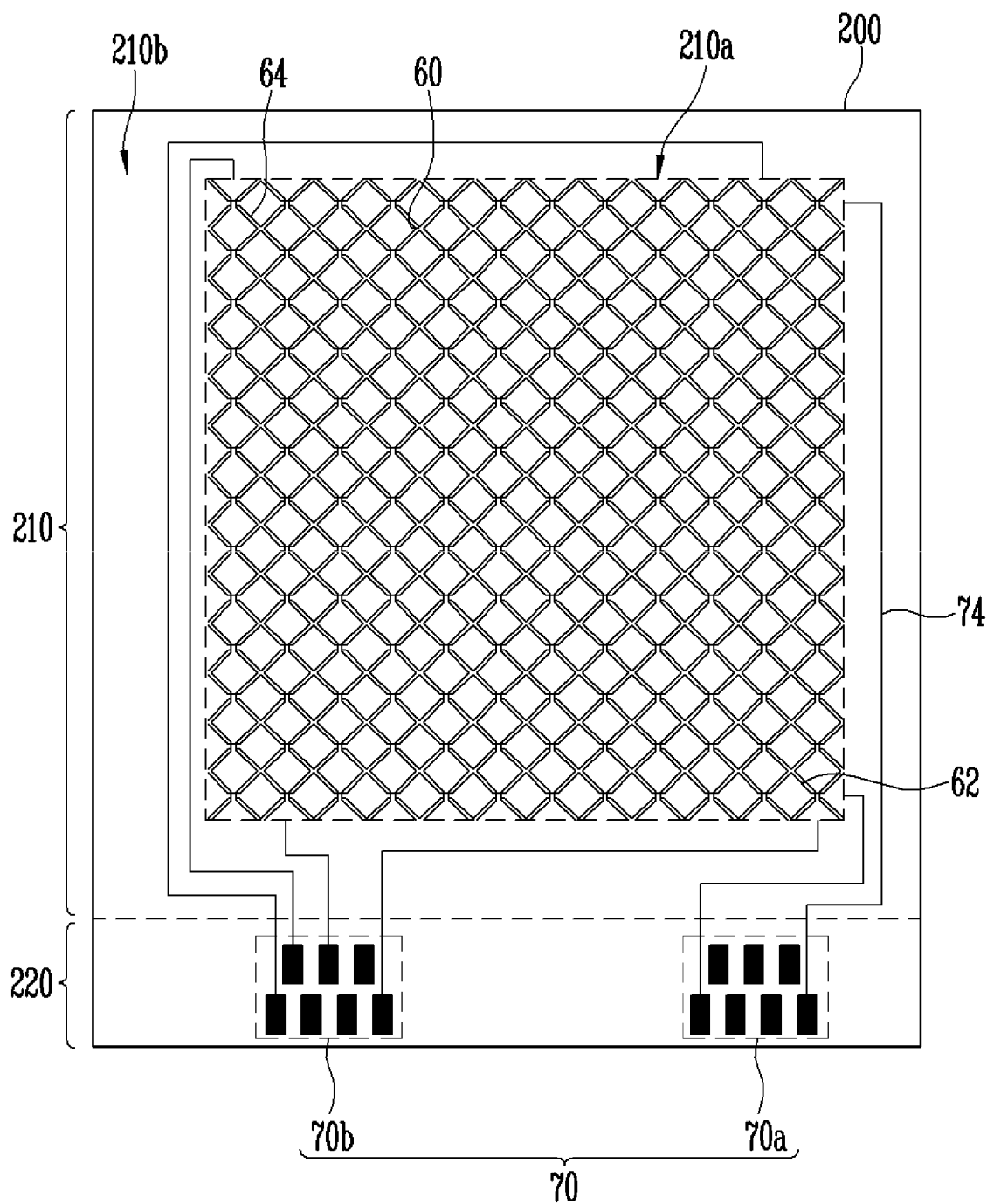
FIG. 5 is a plan view illustrating a second film substrate according to an embodiment of the present inventive concept.

Referring to FIG. 5, the third plane 210 of the second film substrate 200 includes a display region 210a and a non-display region 210b formed in regions corresponding to the display region 110a and the non-display region 110b of the first plane 110, respectively. The touch sensor 60 is provided in the display region 210a and a plurality of conductive lines 74 for connecting the touch sensor 60 to the third pads 70 may be provided in the non-display region 210b.

The touch sensor 60 includes a plurality of first sensing electrodes 62 arranged in a first direction (for example, an X axis direction) and a plurality of second sensing electrodes 64 arranged in a second direction (for example, a Y axis direction) that intersects the first direction. The plurality of first sensing electrodes 62 and the plurality of second sensing electrodes 64 are electrically isolated from each other.

The third pads 70 include a plurality of pads. Some pads are connected to the plurality of first sensing electrodes 62 through the conductive lines 74 and the other pads are connected to the plurality of second sensing electrodes 64 through the conductive lines 74. In FIG. 5, first third pads 70a including pads connected to the plurality of first sensing electrodes 62 and second third pads 70b including pads connected to the plurality of second sensing electrodes 64 are illustrated. However, the first third pads 70a and the second third pads 70b may be integrated into one or the third pads 70 may be divided into a plurality of pads.

Referring to FIG. 4, the first film substrate 100 and the second film substrate 200 adhere to each other by the transparent adhesive layer 300 interposed between the first film substrate 100 and the second film substrate 200 so that the pixels 10 and the touch sensor 60 face each other. At this time, a plurality of conductive balls 400 are interposed between the second pads 50 and the third pads 70 so that the touch sensor 60 may be electrically connected to the first pads 40 through the third pads 70 and the second pads 50.

In order to display the image, the first pads 40 includes not only pads to which a signal is input from the outside but also pads for providing the signal input from the outside to the first and second sensing electrodes 62 and 64 through the second pads 50 and the third pads 70 or for outputting the signal sensed by the first and second sensing electrodes 62 and 64 to the outside.

In the flat panel display device illustrated in FIG. 1A, the surface of the first film substrate 100 has the step difference and the surface of the second film substrate 250 is flat. On the other hand, in the flat panel display device illustrated in FIG. 4, both the surface of the first film substrate 100 and the surface of the second film substrate 200 have the step differences.

In addition, in the flat panel display device illustrated in FIG. 4, a diameter of the conductive ball 400 is smaller than a diameter of the conductive ball 450 in the flat panel display device illustrated in FIG. 1A.

When it is assumed that both the surface of the first film substrate 100 and the surface of the second film substrate 250 are flat, a distance between the second pads 50 of the first film substrate 100 and the third pad 70 of the second film substrate 250 is about 20 µm. The distance between the second pads 50 and the third pads 70 is reduced by the step difference of the surface of the first film substrate 100 and may be about 15 µm in the flat panel display device illustrated in FIG. 1A. The distance between the second pads 50 and the third pads 70 is reduced by the step differences of the surface of the first film substrate 100 and the surface of the second film substrate 200 and may be about 10 µm in the flat panel display device illustrated in FIG. 4.

As described above, when the step differences are formed in the surface of the first film substrate 100 and/or the surfaces of the second film substrates 200 and 250, since the distance between the second pads 50 and the third pads 70 may be reduced, the diameters of the conductive balls 400 and 450 may also be reduced. The reduction of the diameters of the conductive balls 400 and 450 may depends on the step difference formed in the surface of the first film substrate 100 and/or the surfaces of the second film substrates 200 and 250 and may be about 5 µm through 15 µm, which may solve the following problems.

First, in the second pads 50 and the third pads 70, a distance between pads may be determined in proportion to the diameters of the conductive balls 400 and 450. When the diameters of the conductive balls 400 and 450 increase, since the distance between the pads must also increase, there are limitations on reducing areas of the second pads 50 and the third pads 70. On the other hand, according to the embodiment of the present inventive concept, it is possible to reduce the distance between the pads by using the conductive balls 400 and 450 with small diameters and to easily implement a high resolution flat panel display device.

Second, when the conductive balls 400 with large diameters are included in the transparent adhesive layer 300, it is difficult to coat the transparent adhesive layer 300 with a uniform thickness. When the thickness uniformity of the transparent adhesive layer 300 deteriorates, dispersion of the conductive balls 400 is non-uniform, which may cause electrical connection defect between the pads. On the other hand, according to the embodiment of the present inventive concept, the conductive balls 400 with small diameters are used so that the transparent adhesive layer 300 may be coated with a uniform thickness. As a result, the dispersion of the conductive balls 400 becomes uniform and the electrical connection defect between the pads may be prevented.

Third, according to the embodiment of the present inventive concept, the conductive balls 400 and 450 with small diameters are used so that manufacturing expenses may be reduced.

A method of manufacturing a flat panel display device including a touch screen according to an embodiment of the present inventive concept will be described in detail.

FIGS. 6A through 6E are cross-sectional views illustrating a method of manufacturing a flat panel display device including a touch screen according to an embodiment of the present inventive concept, which will be described with reference to FIGS. 2 and 3.

Figure 6A:
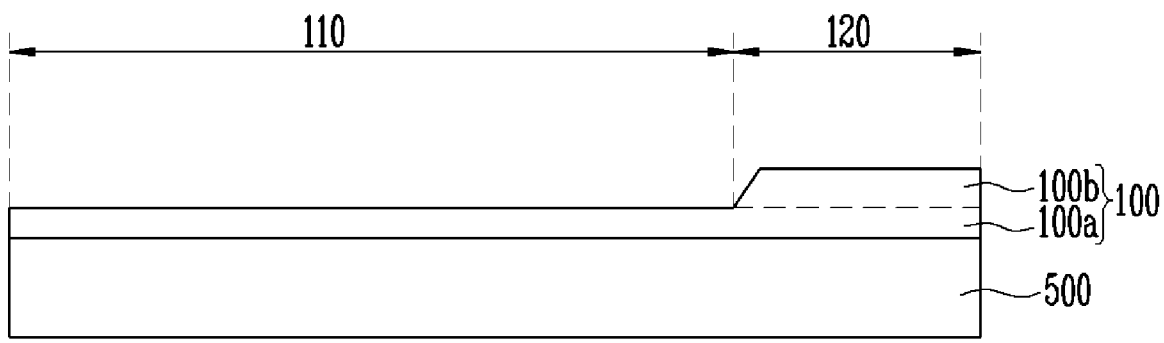
FIGS. 6A, 6B, 6C, 6D and 6E are cross-sectional views illustrating a method of manufacturing a flat panel display device including a touch screen according to an embodiment of the present inventive concept.

Referring to FIG. 6A, the first film substrate 100 including the first plane 110 and the second plane 120 higher than the first plane 110 is formed on a first supporting substrate 500.

The first film substrate 100 may be formed by forming an insulating layer on the first supporting substrate 500 and removing the insulating layer in a region corresponding to the first plane 110 by a predetermined thickness or by sequentially forming a first insulating layer 100a and a second insulating layer 100b on the first supporting substrate 500 in the first plane 110 and the second plane 120 and removing the second insulating layer 100b in a region corresponding to the first plane 110.

In order to form the first plane 110, a photolithography and etching process using a mask may be performed. Step difference at which the first plane 110 and the second plane 120 are adjacent to each other may be obliquely formed.

The first film substrate 100 as a transparent and flexible organic material may be formed of, for example, polydimethylsiloxane (PDMS), polyimide, polycarbonate (PC), polybenzimidazol, polystyrene (PS), polyurethane, polyaniline, polyvinyl alcohol (PVA), polyethylene glycol (PEG), polyvinylchloride (PVC), polyethylene, polyethylene terephthalate, or polyethylene-naphthalate, etc.

The first plane 110 may be easily formed by an exposing and developing process using a mask when the photosensitive organic material is used.

Figure 6B:
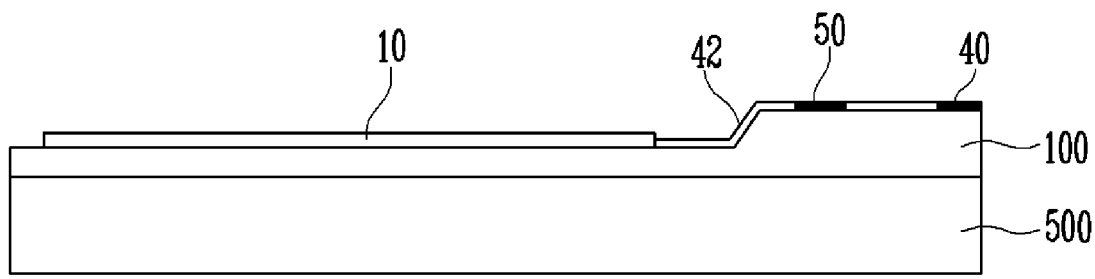

Referring to FIG. 6B, the pixels 10 for displaying an image is formed on the first plane 110 of the first film substrate 100 and the first pads 40 to which the signal is input from the outside in order to display the image and the second pads 50 connected to the first pads 40 are formed on the second plane 120.

Referring to FIG. 2, the first plane 110 of the first film substrate 100 may include the display region 110a in which an image is displayed and the non-display region 110b surrounding the display region 110a.

The pixels 10 for displaying an image is provided in the display region 110a of the first plane 110 and the at least one driving circuit 20 and 30 for driving the pixels 10 may be provided in the non-display region 110b of the first plane 110.

The pixels 10 may include, for example, the plurality of OLEDs disposed between the plurality of scan lines and the plurality of data lines in a matrix configuration and the TFT and capacitors connected to the OLEDs.

The driving circuit 20, for example, as the scan driver may be connected to the plurality of scan lines (not shown). The driving circuit 30, for example, as the data driver may be connected to the plurality of data lines (not shown).

The driving circuits 20 and 30 and the first pads 40, and the first pads 40 and the second pads 50 are connected by the conductive lines 42

Figure 6C:
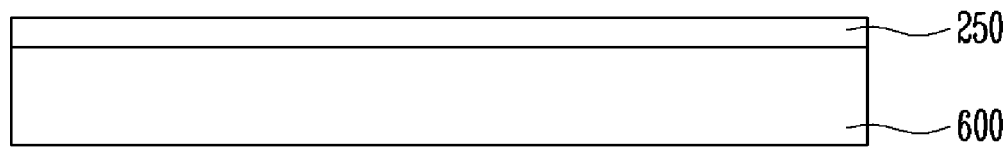

Referring to FIG. 6C, the second film substrate 250 is formed on a second supporting substrate 600.

The second film substrate 250 as a transparent and flexible organic material may be formed of the same material as the first film substrate 100.

Figure 6D:
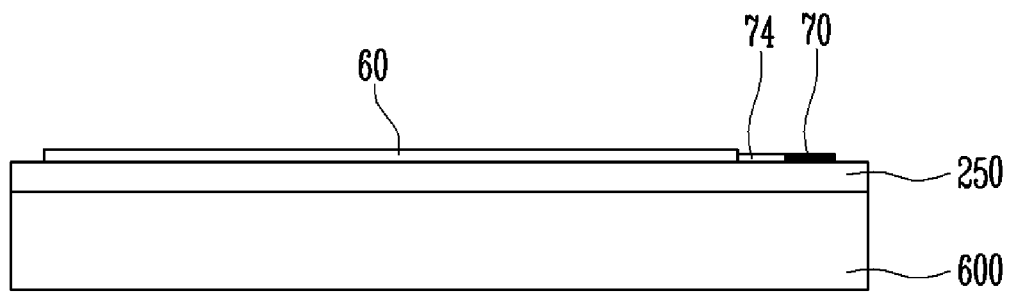

Referring to FIG. 6D, the touch sensor 60 and the third pads 70 connected to the touch sensor 60 are formed on the second film substrate 250. The third pads 70 are formed in a position corresponding to the second pads 50 of the first film substrate 100 in a plan view.

Referring to FIG. 3, the touch sensor 60 includes the plurality of first sensing electrodes 62 arranged in the first direction (for example, the X axis direction) and the plurality of second sensing electrodes 64 arranged in the second direction (for example, the Y axis direction) that intersects the first direction.

The third pads 70 include the plurality of pads. Some pads are connected to the plurality of first sensing electrodes 62 through the conductive lines 74 and the other pads are connected to the plurality of second sensing electrodes 64 through the conductive lines 74.

Figure 6E:
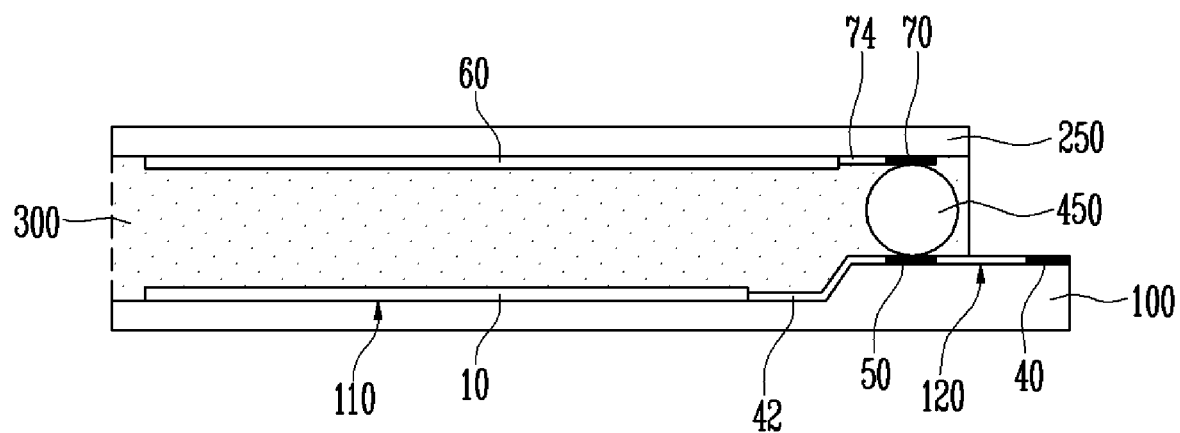

Referring to FIG. 6E, the first film substrate 100 and the second film substrate 250 are arranged so that the pixels 10 and the touch sensor 60 face each other and the first film substrate 100 and the second film substrate 250 adhere to each other in a state in which the transparent adhesive layer 300 is interposed between the first film substrate 100 and the second film substrate 250. At this time, the plurality of conductive balls 450 are interposed between the second pads 50 and the third pads 70 so that the second pads 50 and the third pads 70 are electrically connected by the conductive balls 450.

In accordance with a material of the transparent adhesive layer 300, hardening may be performed after performing compression on the first film substrate 100 and the second film substrate 250.

For example, the transparent adhesive layer 300 is coated on a front surface of the first film substrate 100 or the second film substrate 250 and the plurality of conductive balls 450 may be included in the transparent adhesive layer 300 of a portion corresponding to the second pads 50 or the third pads 70.

Then, the first supporting substrate 500 is separate from the first film substrate 100 and the second supporting substrate 600 is separate from the second film substrate 250.

FIGS. 7A through 7E are cross-sectional views illustrating a method of manufacturing a flat panel display device including a touch screen according to another embodiment of the present inventive concept, which will be described with reference to FIGS. 2 and 5.

Figure 7A:
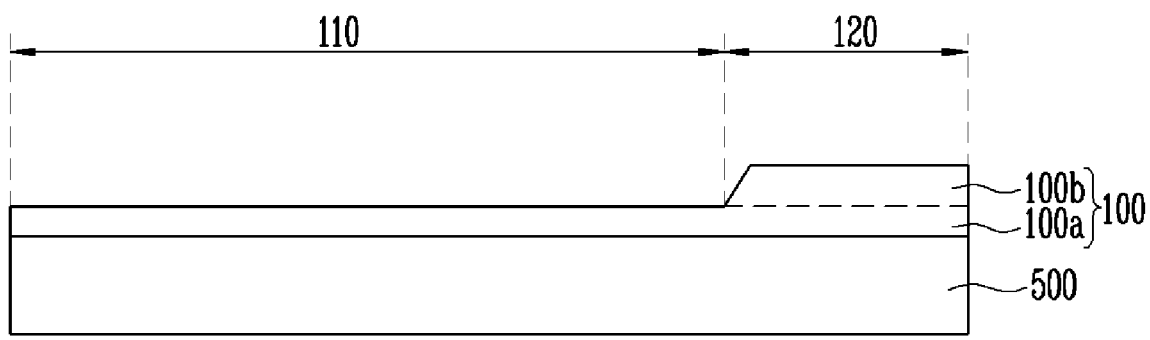
FIGS. 7A, 7B, 7C, 7D and 7E are cross-sectional views illustrating a method of manufacturing a flat panel display device including a touch screen according to another embodiment of the present inventive concept.

Referring to FIG. 7A, the first film substrate 100 including the first plane 110 and the second plane 120 higher than the first plane 110 is formed on the first supporting substrate 500.

The first film substrate 100 may be formed by forming an insulating layer on the first supporting substrate 500 and removing the insulating layer in a region corresponding to the first plane 110 by a predetermined thickness or by sequentially forming a first insulating layer 100a and a second insulating layer 100b on the first supporting substrate 500 in the first plane 110 and the second plane 120 and removing the second insulating layer 100b in a region corresponding to the first plane 110.

In order to form the first plane 110, a photolithography and etching process using a mask may be performed. Step difference at which the first plane 110 and the second plane 120 are adjacent to each other may be obliquely formed.

The first film substrate 100 as a transparent and flexible organic material may be formed of, for example, polydimethylsiloxane (PDMS), polyimide, polycarbonate (PC), polybenzimidazol, polystyrene (PS), polyurethane, polyaniline, polyvinyl alcohol (PVA), polyethylene glycol (PEG), polyvinylchloride (PVC), polyethylene, polyethylene terephthalate, or polyethylene-naphthalate, etc.

The first plane 110 may be easily formed by an exposing and developing process using a mask when the photosensitive organic material is used.

Figure 7B:
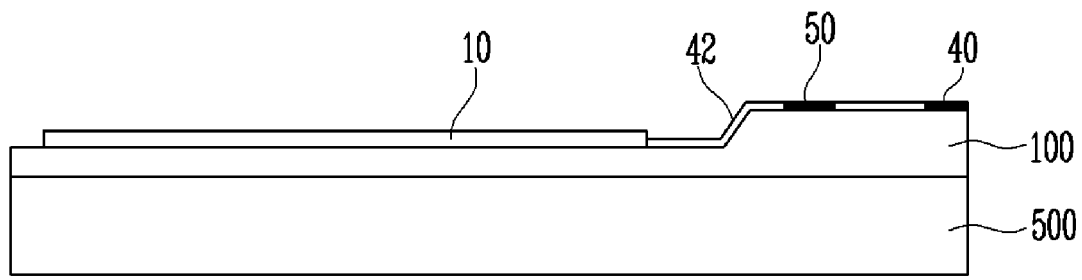

Referring to FIG. 7B, the pixels 10 for displaying an image is formed on the first plane 110 of the first film substrate 100 and the first pads 40 to which the signal is input from the outside in order to display the image and the second pads 50 connected to the first pads 40 are formed on the second plane 120.

Referring to FIG. 2, the first plane 110 of the first film substrate 100 may include the display region 110a in which an image is displayed and the non-display region 110b surrounding the display region 110a.

The pixels 10 for displaying an image is provided in the display region 110a of the first plane 110 and the at least one driving circuit 20 and 30 for driving the pixels 10 may be provided in the non-display region 110b of the first plane 110.

The pixels 10 may include, for example, the plurality of OLEDs disposed between the plurality of scan lines and the plurality of data lines in a matrix configuration and the TFT and capacitors connected to the OLEDs.

The driving circuit 20, for example, as the scan driver may be connected to the plurality of scan lines (not shown). The driving circuit 30, for example, as the data driver may be connected to the plurality of data lines (not shown).

The driving circuits 20 and 30 and the first pads 40, and the first pads 40 and the second pads 50 are connected by the conductive lines 42.

Figure 7C:
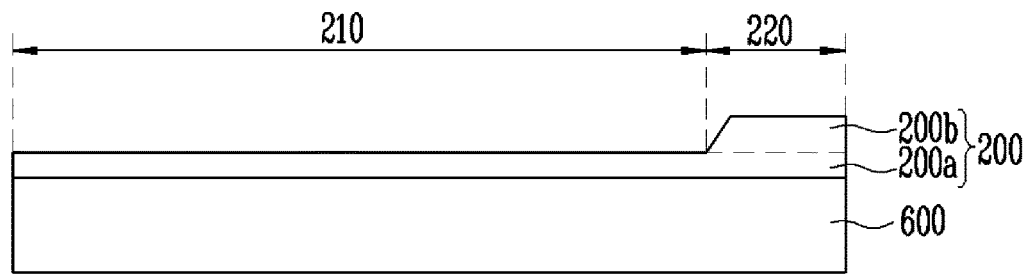

Referring to FIG. 7C, the second film substrate 200 including the third plane 210 and the fourth plane 220 higher than the third plane 210 is formed on the second supporting substrate 600. The fourth plane 220 and the second plane 120 may overlap each other in a plan view.

The third plane 210 and the fourth plane 220 of the second film substrate 200 are formed in regions correspond to the first plane 110 and the second plane 120 of the first film substrate 100, respectively.

The second film substrate 200 may be formed by forming an insulating layer on the second supporting substrate 600 and removing the insulating layer in a region corresponding to the third plane 210 by a predetermined thickness or by sequentially forming a third insulating layer 200a and a fourth insulating layer 200b on the second supporting substrate 600 in the third plane 210 and the fourth plane 220 and removing the fourth insulating layer 200b in a region corresponding to the third plane 210.

In order to form the third plane 210, a photolithography and etching process using a mask may be performed. Step difference at which the third plane 210 and the fourth plane 220 are adjacent to each other may be obliquely formed.

The second film substrate 200 as a transparent and flexible organic material may be formed of the same material as the first film substrate 100.

Figure 7D:
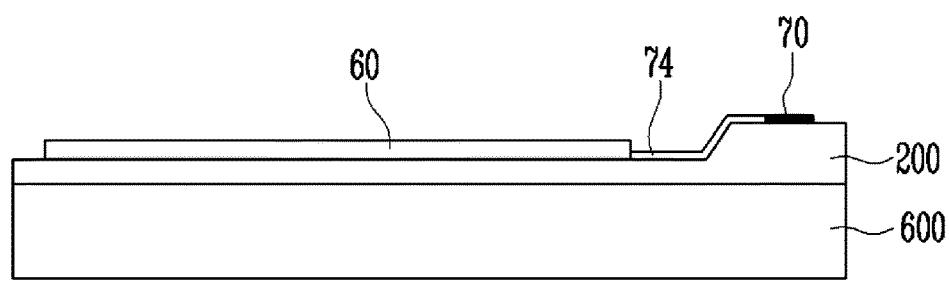

Referring to FIG. 7D, the touch sensor 60 is formed on the third plane 210 of the second film substrate 200 and the third pads 70 connected to the touch sensor 60 by the conductive lines 74 is formed on the fourth plane 220. The third pads 70 are formed in a region corresponding to the second pad 50 of the first film substrate 100 in a plan view.

Referring to FIG. 5, the touch sensor 60 includes the plurality of first sensing electrodes 62 arranged in the first direction (for example, the X axis direction) and the plurality of second sensing electrodes 64 arranged in the second direction (for example, the Y axis direction) that intersects the first direction.

The third pads 70 include the plurality of pads. Some pads are connected to the plurality of first sensing electrodes 62 through the conductive lines 74 and the other pads are connected to the plurality of second sensing electrodes 64 through the conductive lines 74.

Figure 7E:
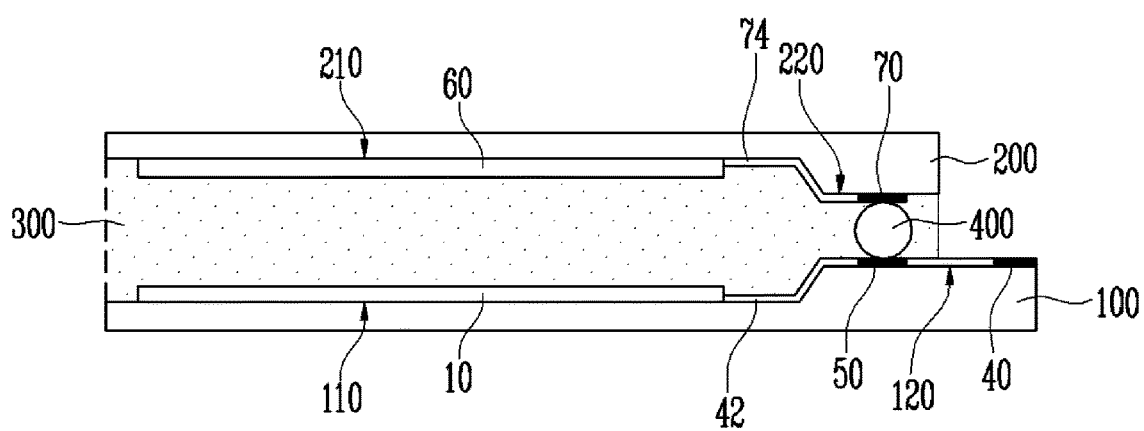

Referring to FIG. 7E, the first film substrate 100 and the second film substrate 200 are arranged so that the pixels 10 and the touch sensor 60 face each other and the first film substrate 100 and the second film substrate 200 adhere to each other in a state in which the transparent adhesive layer 300 is interposed between the first film substrate 100 and the second film substrate 200. At this time, the plurality of conductive balls 400 are interposed between the second pads 50 and the third pads 70 so that the second pads 50 and the third pads 70 are electrically connected by the conductive balls 400.

In accordance with a material of the transparent adhesive layer 300, hardening may be performed after performing compression on the first film substrate 100 and the second film substrate 200.

For example, the transparent adhesive layer 300 is coated on a front surface of the first film substrate 100 or the second film substrate 200 and the plurality of conductive balls 400 may be included in the transparent adhesive layer 300 of in a region corresponding to the second pads 50 or the third pads 70.

Then, the first supporting substrate 500 is separate from the first film substrate 100 and the second supporting substrate 600 is separate from the second film substrate 200.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A display device comprising:
   a substrate including a first region and a second region, the first region including a display region and a non-display region outside the display region;
   a first layer including a plurality of pixels configured to display an image and disposed in the display region;
   pads disposed on the substrate in the second region and including first pads and second pads, wherein the first pads are configured to be provided with an image signal to display the image and the second pads are configured to be provided with a touch signal;
   a first conductive member disposed in the second region and electrically connected to the first pads;
   a second layer including a plurality of touch electrodes configured to be provided with touch input and positioned in the display region; and
   a second conductive member disposed in the second region and electrically connected to the touch electrodes and the second pads,
   wherein the first layer and the second layer are separated by a first distance, the first conductive member and the second conductive member are separated by a second distance, and
   wherein the first distance is larger than the second distance.

2. The display device of claim 1, wherein a thickness of the substrate in the second region is thicker than that of the substrate in the first region.

3. The display device of claim 1, wherein the substrate comprises:
   a first insulating layer overlapping the first region and the second region; and
   a second insulating layer selectively disposed on the first insulating layer in a region corresponding to the second region.

4. The display device of claim 1, wherein the second region includes the non-display region.

5. The display device of claim 1, further comprising at least one driving circuit disposed in the non-display region of the first region and configured to drive the plurality of pixels in accordance with the image signal input from the outside through the pads.

6. The display device of claim 1, wherein the plurality of pixels comprise organic light emitting diodes (OLED).

7. The display device of claim 1, wherein the plurality of touch electrodes comprise:
   a plurality of first sensing electrodes arranged in a first direction; and
   a plurality of second sensing electrodes arranged in a second direction intersecting the first direction.

8. The display device of claim 7, wherein the second conductive member is respectively connected to the plurality of first sensing electrodes and the plurality of second sensing electrodes.

9. The display device of claim 8, wherein the first conductive member is disposed in a region corresponding to the second conductive member.

10. The display device of claim 1, further comprising an outer layer arranged to face the substrate,
wherein the second layer is disposed on the outer layer in a region corresponding to the display region of the substrate.

11. The display device of claim 10, wherein the outer layer comprises:
a third region disposed in a region corresponding to the first region; and
a fourth region disposed in a region corresponding to the second region and having a thickness different from the third region,
wherein the second layer is disposed on the third region, and
wherein the second conductive member is disposed on the fourth region.

12. The display device of claim 11, wherein a thickness of the outer layer in the fourth region is thicker than that of the outer layer in the third region.

13. The display device of claim 11, wherein the outer layer comprises:
a third insulating layer overlapping the third region and the fourth region; and
a fourth insulating layer selectively formed on the third insulating layer of the fourth region.

14. The display device of claim 10, further comprising a transparent adhesive layer interposed between the substrate and the outer layer.

15. The display device of claim 1, further comprising a plurality of conductive balls configured to electrically connect the first conductive member and the second conductive member.

16. The display device of claim 15, wherein the plurality of conductive balls have diameters of 5.1 μm through 15 μm.

17. The display device of claim 1, wherein the first conductive member and the second conductive member are overlapped in the second region in a plan view.

18. The display device of claim 17, wherein the second conductive member is not directly contacted with the substrate.

19. The display device of claim 18, wherein the second layer and the pads connected to the second layer are disposed in a same plane.

* * * * *